United States Patent
Yang et al.

(10) Patent No.: US 11,368,092 B2
(45) Date of Patent: Jun. 21, 2022

(54) INTERLEAVED MULTIPHASE CONVERTER WITH COUPLED INDUCTOR AND ACTIVE CLAMP CIRCUIT

(71) Applicant: Baidu USA LLC, Sunnyvale, CA (US)

(72) Inventors: Huawei Yang, Sunnyvale, CA (US); Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 154 days.

(21) Appl. No.: 16/921,038

(22) Filed: Jul. 6, 2020

(65) Prior Publication Data

US 2022/0006386 A1   Jan. 6, 2022

(51) Int. Cl.
| | |
|---|---|
| H02M 3/335 | (2006.01) |
| H05K 7/14 | (2006.01) |
| H02M 1/084 | (2006.01) |
| H02J 9/06 | (2006.01) |
| H02M 3/158 | (2006.01) |
| H02M 3/00 | (2006.01) |

(52) U.S. Cl.
CPC ........ *H02M 3/1586* (2021.05); *H02J 9/061* (2013.01); *H02M 1/084* (2013.01); *H02M 3/01* (2021.05); *H02M 3/33569* (2013.01); *H05K 7/1492* (2013.01)

(58) Field of Classification Search
None
See application file for complete search history.

(56) References Cited

U.S. PATENT DOCUMENTS

| | | | | |
|---|---|---|---|---|
| 11,075,608 | B1 * | 7/2021 | Hande | H02M 1/14 |
| 2008/0101097 | A1 * | 5/2008 | Kawasaki | H01F 30/06 336/200 |
| 2021/0288576 | A1 * | 9/2021 | Rizzolatti | H02M 1/007 |

* cited by examiner

*Primary Examiner* — Jared Fureman
*Assistant Examiner* — Aqeel H Bukhari
(74) *Attorney, Agent, or Firm* — Womble Bond Dickinson (US) LLP

(57) ABSTRACT

Embodiments are disclosed of a multiphase converter that includes a main switch circuit, an active clamp circuit, a voltage multiplier cell, and an output capacitor. The main switch circuit includes a primary winding of a first coupled inductor; a primary winding of a second coupled inductor connected in parallel with the primary winding of the first coupled inductor and in parallel with an input voltage; a first switch connected between the primary winding of the first coupled inductor and the input voltage; and a second switch connected between the primary winding of the second coupled inductor and the input voltage. The active clamp circuit includes a third switch, a fourth switch, and a first capacitor. The voltage multiplier cell includes a secondary winding of the first coupled inductor, a secondary winding of the second coupled inductor, a second capacitor, a first diode, the first capacitor, and the third switch.

20 Claims, 6 Drawing Sheets

INTERLEAVED MULTIPHASE CONVERTER WITH COUPLED INDUCTOR AND ACTIVE CLAMP CIRCUIT

TECHNICAL FIELD

The disclosed embodiments relate generally to multiphase converters and in particular, but not exclusively, to a multiphase converter with a coupled inductor and an active clamp circuit.

BACKGROUND

Battery energy storage is a significantly important energy storage method for many applications, such as electric vehicles, consumer electronics, micro-grids, solar and wind power, and data center backup units. Battery cells provide essential energy to support applications as either a primary source of power or as a backup when the main source is unavailable. Thus, the reliability of battery energy storage is highly important to ensure power availability and functionality.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Figure 1:
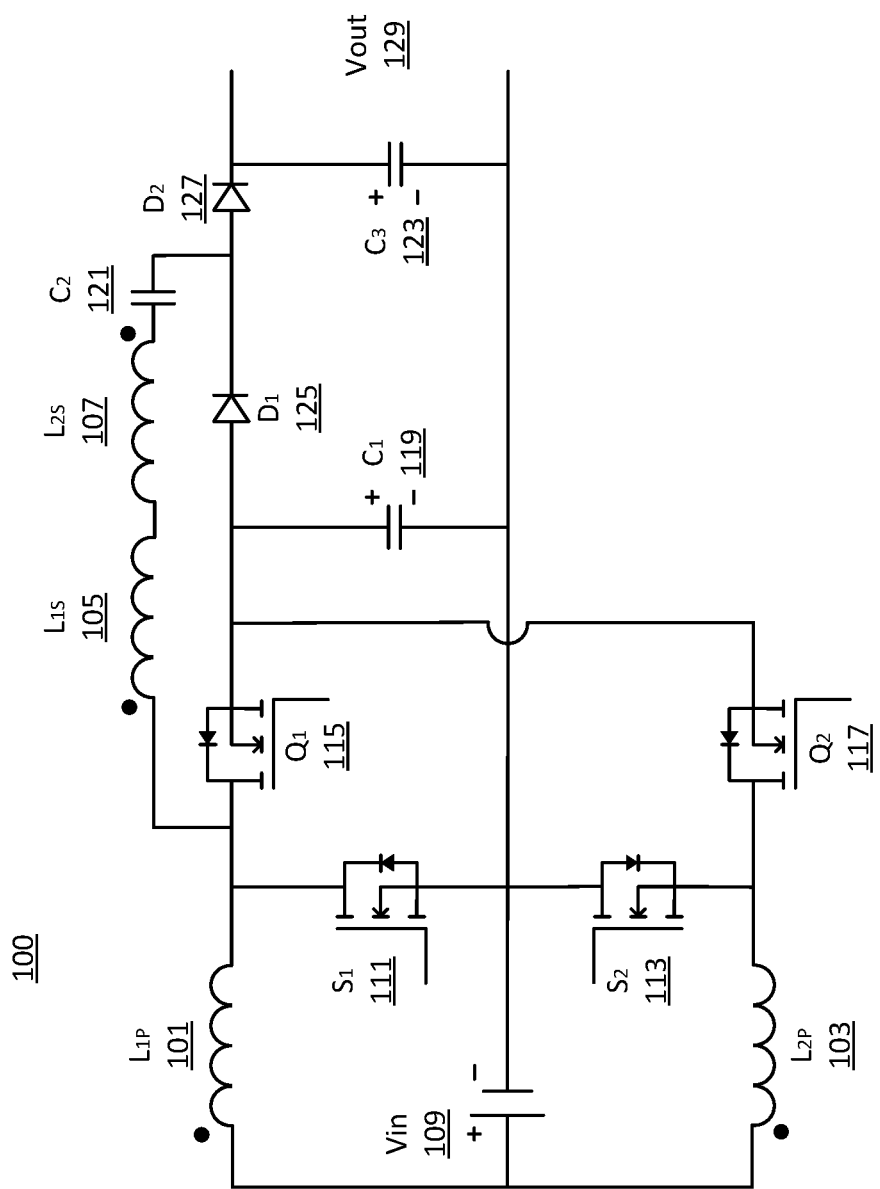
FIG. 1 is a circuit diagram for a multiphase converter, according to one embodiment of the disclosure.

Embodiments are described of a high-gain DC-DC converter and a method of operating such a converter. In some embodiments, the converter disclosed herein can lift up a low input voltage, for instance from between around 20-60V, to a much higher voltage, for example, 400V or higher. This input voltage range is suitable for battery, fuel cell, and solar applications.

Reference throughout this specification to "one embodiment" or "an embodiment" means that a described feature, structure, or characteristic can be included in at least one described embodiment, so that appearances of "in one embodiment" or "in an embodiment" do not necessarily all refer to the same embodiment. Furthermore, the particular features, structures, or characteristics may be combined in any suitable manner in one or more embodiments.

In one aspect, a multiphase converter is disclosed. The multiphase converter includes a main switch circuit, an active clamp circuit, a voltage multiplier cell, and an output capacitor. The main switch circuit includes a primary winding of a first coupled inductor; a primary winding of a second coupled inductor connected in parallel with the primary winding of the first coupled inductor and in parallel with an input voltage; a first switch connected between the primary winding of the first coupled inductor and the input voltage; and a second switch connected between the primary winding of the second coupled inductor and the input voltage. The active clamp circuit includes a third switch, a fourth switch, and a first capacitor, which may be implemented as a part of the voltage multiplier cell.

The voltage multiplier cell includes a secondary winding of the first coupled inductor, a secondary winding of the second coupled inductor, a second capacitor, a first diode, the first capacitor, and the third switch. In some embodiments, the fourth switch is connected in parallel with the third switch. In some embodiments, the secondary winding of the first coupled inductor, the secondary winding of the second coupled inductor, and the second capacitor are connected in series with one another, and in parallel with the third switch and the first diode. In some embodiments, the second diode is connected between the second capacitor and the output capacitor.

In some embodiments, the converter is configured to operate in a first mode, wherein the first switch and the second switch are closed and the third switch and the fourth switch are open. In some embodiments, the converter is configured to operate in a second mode subsequent to operating in the first mode, wherein the first switch is closed and the second switch, third switch, and fourth switch are open. In some embodiments, the converter is configured to operate in a third mode subsequent to operating in the second mode, wherein the first switch, second switch, and third switch are closed, and the fourth switch is open.

According to another aspect, an electronic rack is disclosed. The rack includes a stack of server chassis, each server chassis including one or more servers; a power supply coupled to the server chassis to provide power to the servers; a battery backup unit (BBU) having a plurality of battery cell packages and each battery cell package containing one or more battery cells, wherein the BBU is configured to provide power to the servers when the power supply is unavailable; and a multiphase converter. The multiphase converter includes a main switch circuit, an active clamp circuit, a voltage multiplier cell, and an output capacitor. The main switch circuit includes a primary winding of a first coupled inductor; a primary winding of a second coupled inductor connected in parallel with the primary winding of the first coupled inductor and in parallel with an input voltage; a first switch connected between the primary winding of the first coupled inductor and the input voltage; and a second switch connected between the primary winding of the second coupled inductor and the input voltage.

The active clamp circuit includes a third switch, a fourth switch, and a first capacitor. The voltage multiplier cell includes a secondary winding of the first coupled inductor, a secondary winding of the second coupled inductor, a second capacitor, a first diode, the first capacitor, and the third switch. In some embodiments, the fourth switch is connected in parallel with the third switch. In some embodiments, the secondary winding of the first coupled inductor, the secondary winding of the second coupled inductor, and the second capacitor are connected in series with one another, and in parallel with the third switch and the first diode. In some embodiments, the second diode is connected between the second capacitor and the output capacitor.

In some embodiments, the system is configured to operate in a first mode, wherein the first switch and the second switch are closed and the third switch and the fourth switch are open. In some embodiments, the system is configured to operate in a second mode subsequent to operating in the first mode, wherein the first switch is closed and the second switch, third switch, and fourth switch are open. In some embodiments, the system is configured to operate in a third mode subsequent to operating in the second mode, wherein the first switch, second switch, and third switch are closed, and the fourth switch is open. In some embodiments, the system also includes a plurality of multiphase converters connected in parallel with one another.

According to another aspect, a method of operating a DC-DC converter is disclosed. The method includes providing a multiphase converter including a main switch circuit, an active clamp circuit, a voltage multiplier cell, and an output capacitor. The main switch circuit includes a primary winding of a first coupled inductor; a primary winding of a second coupled inductor connected in parallel with the primary winding of the first coupled inductor and in parallel with an input voltage; a first switch connected between the primary winding of the first coupled inductor and the input voltage; and a second switch connected between the primary winding of the second coupled inductor and the input voltage.

The active clamp circuit includes a third switch, a fourth switch, and a first capacitor. The voltage multiplier cell includes a secondary winding of the first coupled inductor, a secondary winding of the second coupled inductor, a second capacitor, a first diode, the first capacitor, and the third switch. The method also includes operating the multiphase converter in a first mode, wherein the first switch and the second switch are closed, and the third switch and the fourth switch are open. The method also includes operating the multiphase converter in a second mode subsequent to operating in the first mode, wherein the first switch is closed and the second switch, third switch, and fourth switch are open.

The method also includes operating the multiphase converter in a third mode subsequent to operating in the second mode, wherein the first switch, second switch, and third switch are closed, and the fourth switch is open. In some embodiments, the fourth switch is connected in parallel with the third switch. In some embodiments, the secondary winding of the first coupled inductor, the secondary winding of the second coupled inductor, and the second capacitor are connected in series with one another, and in parallel with the third switch and the first diode. In some embodiments, the second diode is connected between the second capacitor and the output capacitor. In some embodiments, each phase has a 180-degree phase delay when switching.

The present disclosure provides for a high-gain DC-DC converter. In some embodiments, the converter can be used for data center and DC microgrid applications. Such a converter can lift a low input voltage, for instance from about 20V~60V, to a much higher output voltage, for instance, 400V or higher, while achieving high efficiency. The input voltage range is suitable for battery (li-ion, lead-acid), fuel cell, and solar applications. The output voltage has the potential for high voltages thanks to its high gain design.

Battery energy storage is utilized in various applications, such as, electrical vehicles, consumer electronics, medical devices, micro grids, solar and wind power, and data center battery backup units (BBU). Battery storage can provide energy to support applications either as the primary source, or as a backup when the main source is not available. Thus, availability and functionality of battery storage is important. Additionally, for renewable energies, such as fuel cell and solar technologies where voltage levels are often low, converters can be used to lift up the voltage to a much higher voltage level. For data center applications, clean energy (e.g. fuel cell and solar) applications are gaining more attention thanks to zero emission concerns and decreasing cost. Previous attempts at solving converter needs were targeting at putting input sources in series, or having cascaded converters in series. For high gain converters, the converter design disclosed herein stands out as a simple design and highly efficient.

In one embodiment, the converter disclosed herein includes two phases, with each phase connected with an active clamp circuit to store the energy from leakage inductance. In one such embodiment, the two phases are connected to a voltage multiplier cell to boost up the voltage even further. The two phases smooth out the input current ripple.

The devices and method disclosed herein can provide one or more of the following advantages. The converter and methods disclosed herein can provide high gain capabilities in a simple and efficient circuit. In some embodiments, the converter has a wide input voltage range that is suitable for battery, fuel cell, and solar input sources. In some embodiments, changing the coupled inductor turns ratio allows the converter to support not only low voltage, but also high voltage inputs, making it suitable for either single battery/fuel/solar cells or multiple ones in series. Such a design provides increased flexibility and resiliency of DC power while lowering cost. In some embodiments, multiple converters can be connected in parallel for high power applications. For battery and fuel cell applications, the converter disclosed herein can provide support at unit level in a rack, or at a battery or fuel cell rack.

In some embodiments, the converter described herein can be implemented in at least two distinct scenarios. In a first embodiment, the converter can be used at the data center level inside the UPS. Normally, the UPS is AC-DC-AC, where AC comes in, is rectified into DC, then charges the battery, then inverted DC-AC at 380V (3P) or 480V (3P). In the embodiments disclosed herein, the UPS is AC-DC-DC, where the battery voltage can be converted to 400 VDC by adopting this converter. In a second embodiment, the converter can be used at the cluster level, where a dedicated battery cluster/rack is adopted to provide backup/buffer power to the same cluster it is connected. Inside the battery cluster/rack, there is the battery itself and the converter to convert the battery voltage to the 400V level. Inside each server rack, a dedicated power supply can convert 400V down to either 12V or 48V to power the servers. As will be appreciated, the level of 400V is only an example, and other voltage levels can be achieved using the techniques described herein.

FIG. 1 is a circuit diagram for a multiphase converter 100, according to one embodiment of the disclosure. In this embodiment, the converter includes a primary winding of a first coupled inductor $L_{1P}$ 101 and a primary winding of a second coupled inductor $L_{2P}$ 103 connected in parallel with each other, and in parallel with an input voltage Vin 109. The converter also includes a first switch $S_1$ 111 connected between the primary winding of the first coupled inductor $L_{1P}$ 101 and $V_{in}$ 109, and a second switch $S_2$ 113 connected between the primary winding of the second coupled inductor $L_{2P}$ 103 and $V_{in}$ 109. The converter also includes an active clamp circuit including a third switch $Q_1$ 115, a fourth switch $Q_2$ 117, and a first capacitor $C_1$ 119. The converter also includes the secondary winding of the first coupled inductor $L_{1S}$ 105 connected in series with the secondary winding of the second coupled inductor $L_{2S}$ 107 and a second capacitor $C_2$ 121. The converter also includes a first diode $D_1$ 125, a second diode $D_2$ 127, and an output capacitor $C_3$ 123 at the output voltage $V_{out}$ 129.

The proposed circuit topology of one embodiment is shown in FIG. 1. With respect to the windings 101, 103, 105, 107 of the inductors, the black dots in FIG. 1 illustrate their polarity. The third switch $Q_1$ 115, the fourth switch $Q_2$ 117, and the first capacitor $C_1$ 119 are the active clamp circuit, in this embodiment. The voltage multiplier cell includes the secondary winding of the first coupled inductor $L_{1S}$ 105, the secondary winding of the second coupled inductor $L_{2S}$ 107, the second capacitor $C_2$ 121, the first diode $D_1$ 125, the first capacitor $C_1$ 119, and the third switch $Q_1$ 115. The third switch $Q_1$ 115 and the fourth switch $Q_2$ 117 are high-side MOSFETs in the active clamp circuit, in this embodiment, while the first switch $S_1$ 111 and second switch $S_2$ 113 are main switch MOSFETs.

In the embodiments described herein, three main operation modes are discussed. Transient modes caused by leakage inductance are not specifically illustrated in this application, but one skilled in the art will understand that certain transient modes may be implemented in some embodiments of the present disclosure. In some embodiments, multiple converters can be connected in parallel for high power applications.

The converter topology proposed in the present disclosure can have multiple operation modes during a switching cycle. At each switching cycle, if the average voltage on the inductors is zero at steady state, then the voltage of two inductors is given at equations (1) and (2), respectively, where T is the cycle time.

$$<V_{L1P}> = 0 = DT \times V_{in} + (1-D)T(V_{in} - V_{C1}) \quad (1)$$

$$<V_{L2P}> = 0 = DT \times V_{in} + (1-D)T\left(V_{in} + \frac{V_{C1} - V_{C2}}{N}\right) \quad (2)$$

Thus, the voltages for capacitors $C_1$ 119 and $C_2$ 121 can be achieved according to equations (3) and (4), respectively, by solving (1) and (2).

$$V_{C1} = \frac{V_{in}}{1-D} \quad (3)$$

$$V_{C2} = \frac{(N+1)V_{in}}{1-D} \quad (4)$$

Figure 2:
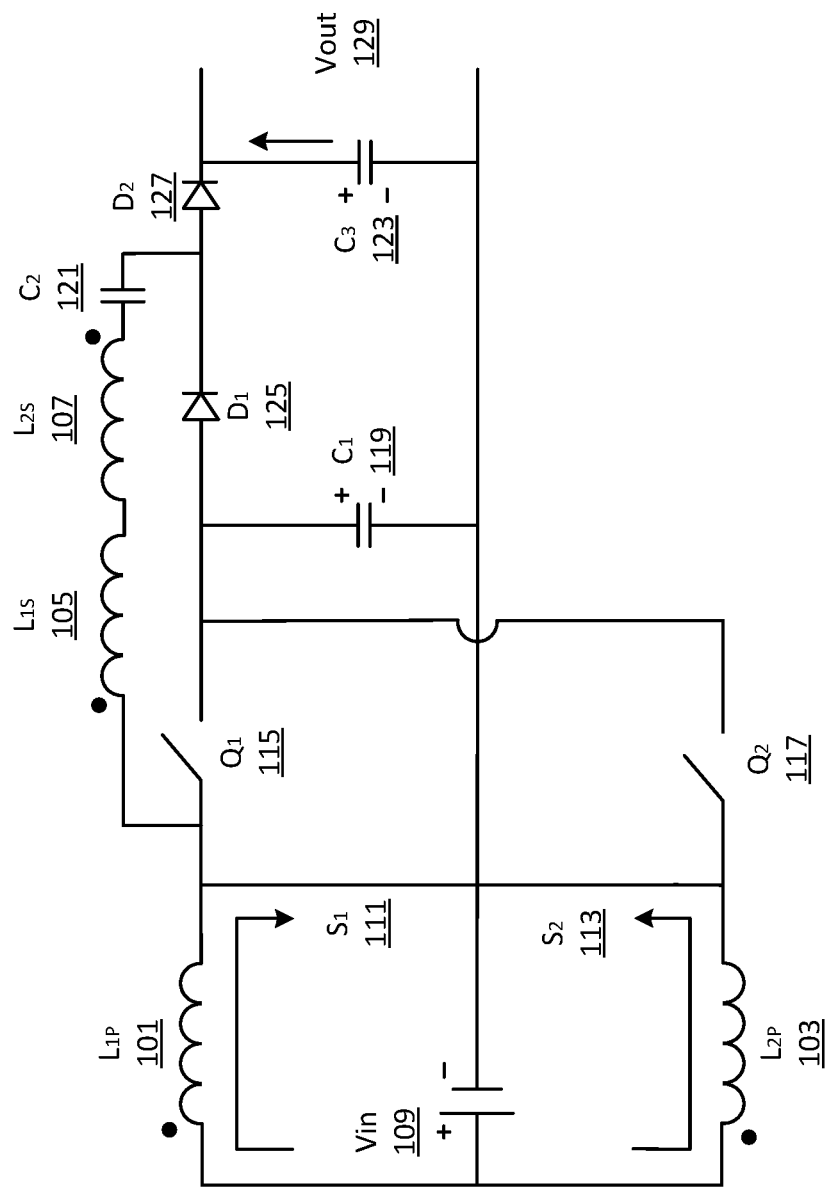
FIG. 2 is circuit diagram for the multiphase converter of FIG. 1 in a first mode of operation, according to one embodiment of the disclosure.

FIG. 2 is circuit diagram for the multiphase converter of FIG. 1 in a first mode of operation, according to one embodiment of the disclosure. In this embodiment, the first switch 111 and the second switch 113 are closed, while the third switch 115 and the fourth switch 117 are opened. The arrows indicate the current flow directions in the first mode of operation.

Figure 3:
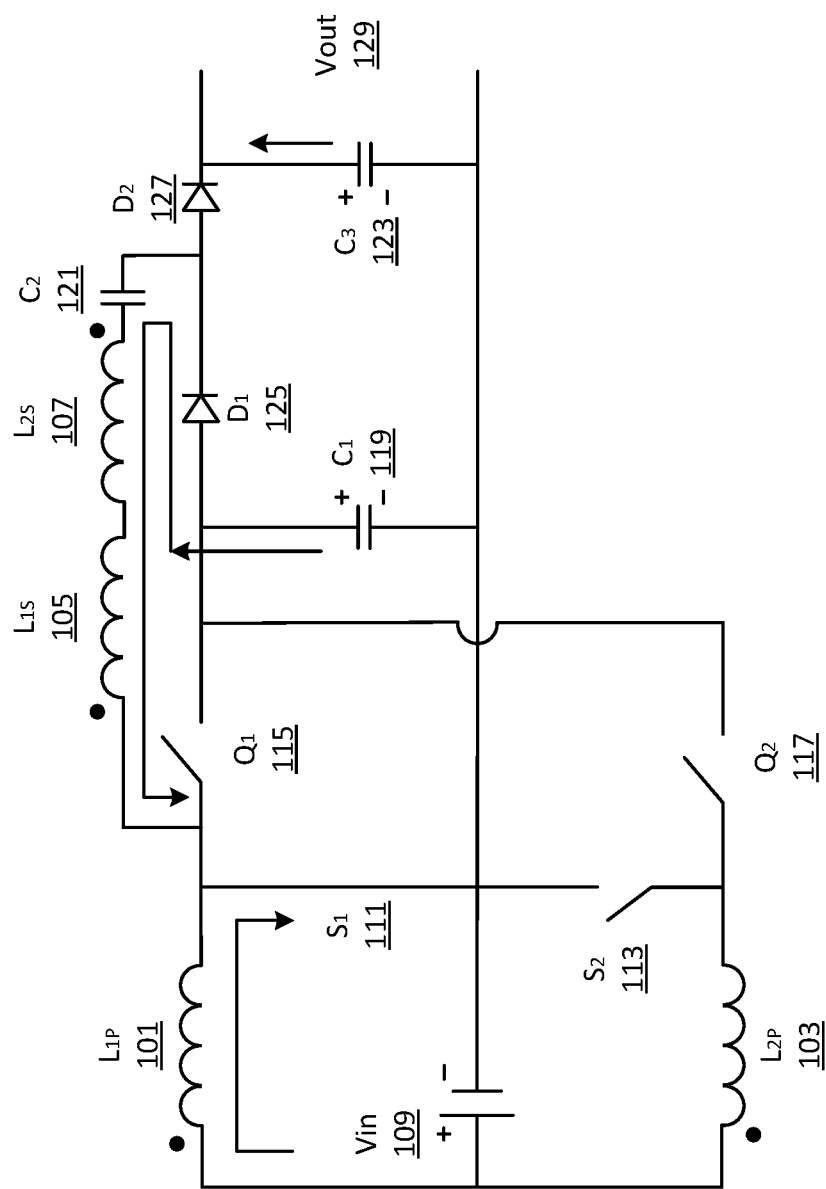
FIG. 3 is circuit diagram for the multiphase converter of FIG. 1 in a second mode of operation, according to one embodiment of the disclosure.

FIG. 3 is circuit diagram for the multiphase converter of FIG. 1 in a second mode of operation, according to one embodiment of the disclosure. In one embodiment, the switches are controlled to operate in the second mode of operation subsequent to operating in the first mode. In this embodiment, during the second mode of operation the first switch 111 is closed, while the second switch 113, the third switch 115, and the fourth switch 117 are open. The arrows in FIG. 3 indicate the current flow directions through the converter in the second mode of operation.

Figure 4:
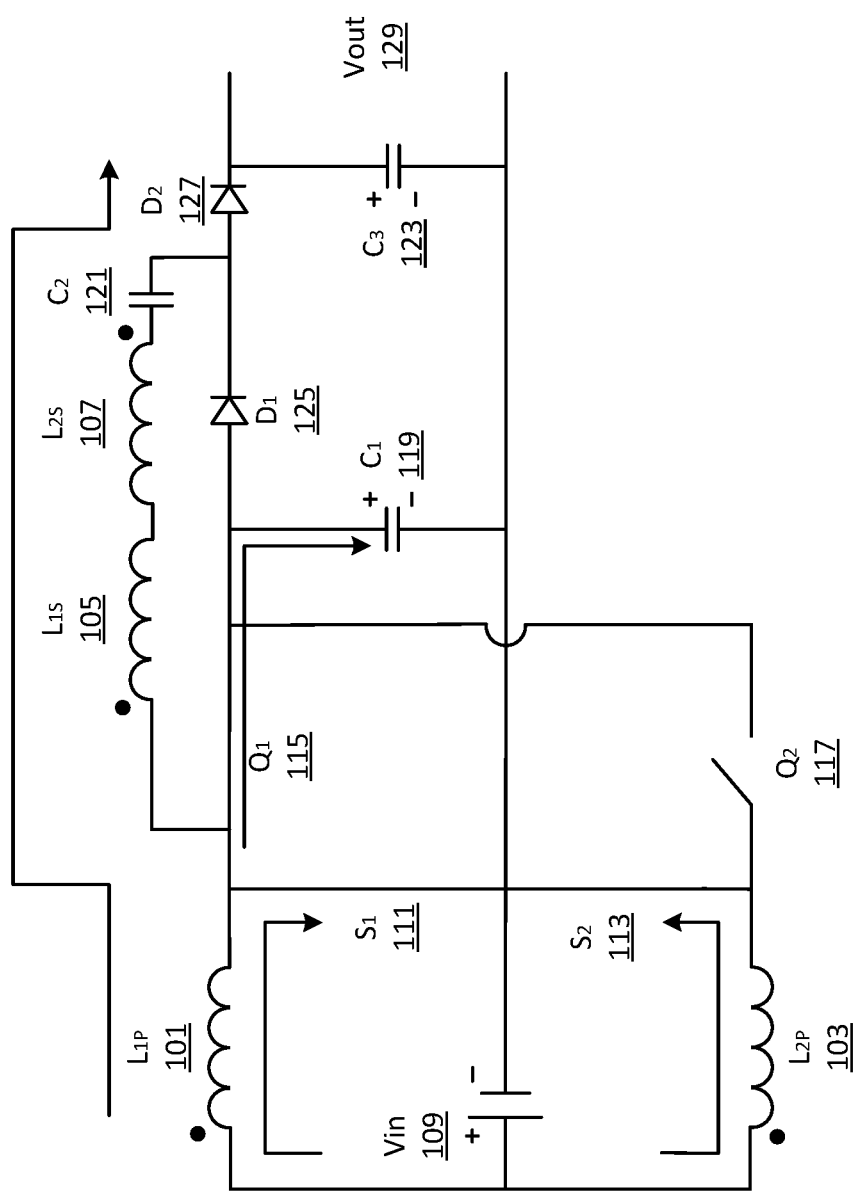
FIG. 4 is circuit diagram for the multiphase converter of FIG. 1 in a third mode of operation, according to one embodiment of the disclosure.

FIG. 4 is circuit diagram for the multiphase converter of FIG. 1 in a third mode of operation, according to one embodiment of the disclosure. In one embodiment, the switches are controlled to operate in the third mode of operation subsequent to operating in the second mode. In this embodiment, during the third mode of operation, the first switch 111, the second switch 113, and the third switch 115 are closed, while the fourth switch 117 is open. The arrows indicate the current flow directions through the converter in the third mode of operation.

Applying Kirchhoff's current law (KCL) to the third mode of operations and equations (1)-(4) above, we arrive at equation (5) below.

$$0 = -V_{C1}N(V_{in} - V_{C1}) - NV_{in} - V_{C2}V_{out} \quad (5)$$

The output voltage Vout can be solved for, as shown in equation (6), providing the overall voltage transfer ratio.

$$V_{out} = \frac{2N+2}{1-D}V_{in} = (1+N)V_{C1} + V_{C2} \quad (6)$$

In this embodiment, the variable N represents the turns ratio of secondary turns to the primary turns within the inductors, while D is the duty cycle. In this topology, both phases should have a similar turns ratio with a slightly different tolerance (10%). The maximum gain is mainly determined by the turns ratio, for instance, 2, 3, or more. The duty cycle can range from above 0.5 to close to 1, depending on the control loop stability. Multiple interleaved phases may be added to achieve even higher gains, in some embodiments. Thus, much higher voltages can be achieved based on different scenarios. For high power application, multiple converters can be arranged in parallel. When switching, each phase has a 180-degree phase delay.

Figure 5:
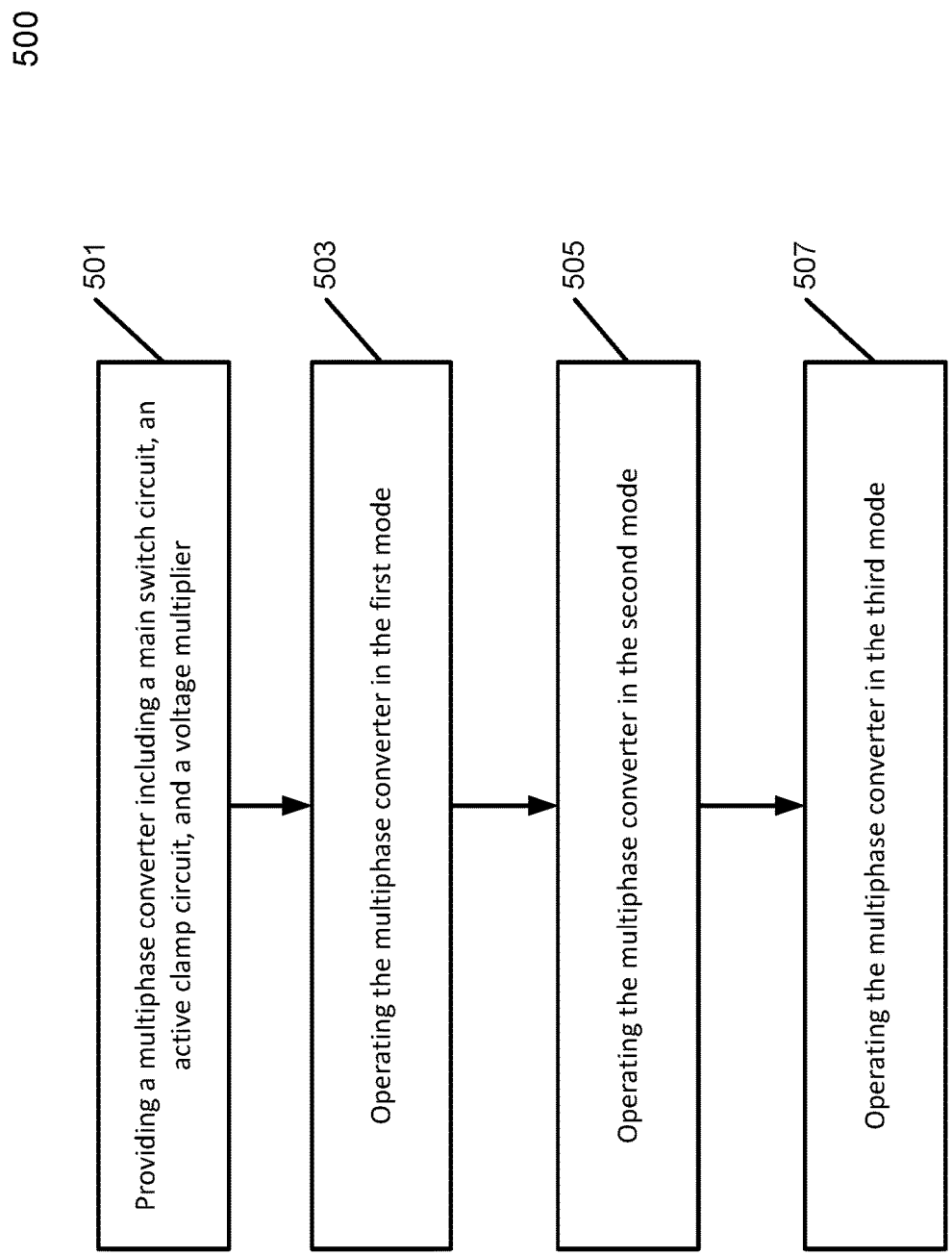
FIG. 5 depicts a flow diagram of a method for operating a multiphase converter, according to one embodiment of the disclosure.

FIG. 5 depicts a flow diagram of a method for operating a multiphase converter, according to one embodiment of the disclosure. Process 500 may be performed by hardware, software, or a combination thereof. Process 500 may be performed, for example, by processing logic of a power supply unit 650, discussed in more detail below. At operation 501, a multiphase converter is provided. The multiphase converter includes a main switch circuit, an active clamp circuit, and a voltage multiplier cell. The main switch circuit includes a primary winding of a first coupled inductor; a primary winding of a second coupled inductor connected in parallel with the primary winding of the first coupled inductor and in parallel with an input voltage; a first switch connected between the primary winding of the first coupled inductor and the input voltage; and a second switch connected between the primary winding of the second coupled inductor and the input voltage. The active clamp circuit includes a third switch, a fourth switch, and a first capacitor. The voltage multiplier cell includes a secondary winding of the first coupled inductor, a secondary winding of the second coupled inductor, a second capacitor, a first diode, the first capacitor, and the third switch. The multiphase converter also includes an output capacitor.

At operation 503, the multiphase converter is operated in a first mode of operation. In the first mode of operation, the first switch and the second switch are closed, and the third switch and the fourth switch are open. An example of the first mode of operation is illustrated in more detail in FIG. 2.

At operation 505, the multiphase converter is operated in a second mode of operation. In the second mode of operation, the first switch is closed, while the second switch, third switch, and fourth switch are open. An example of the second mode of operation is illustrated in more detail in FIG. 3.

At operation 507, the multiphase converter is operated in a third mode of operation. In the third mode of operation, the first switch, second switch, and third switch are closed, while the fourth switch is open. An example of the third mode of operation is illustrated in more detail in FIG. 4.

In data center applications, the converter disclosed herein can be used in a unit, such as a Battery Backup Unit, fuel cell unit, or inside the rack. It can also be used in a battery or fuel cell rack. For solar applications, the converter disclosed herein can be connected to a single solar panel or multiple series or parallel connected solar panels for different voltage ranges. In some embodiments, the active clamp circuit improves efficiency but adds more complexity in control, and thus can be substitutes with passive components. In various embodiments, one phase or more than two phases can also be adopted, depending on the requirements of input current and output voltages. In alternative embodiments, multiple converters can be put in parallel for high power applications, or in series if extreme high voltage is desired.

Figure 6:
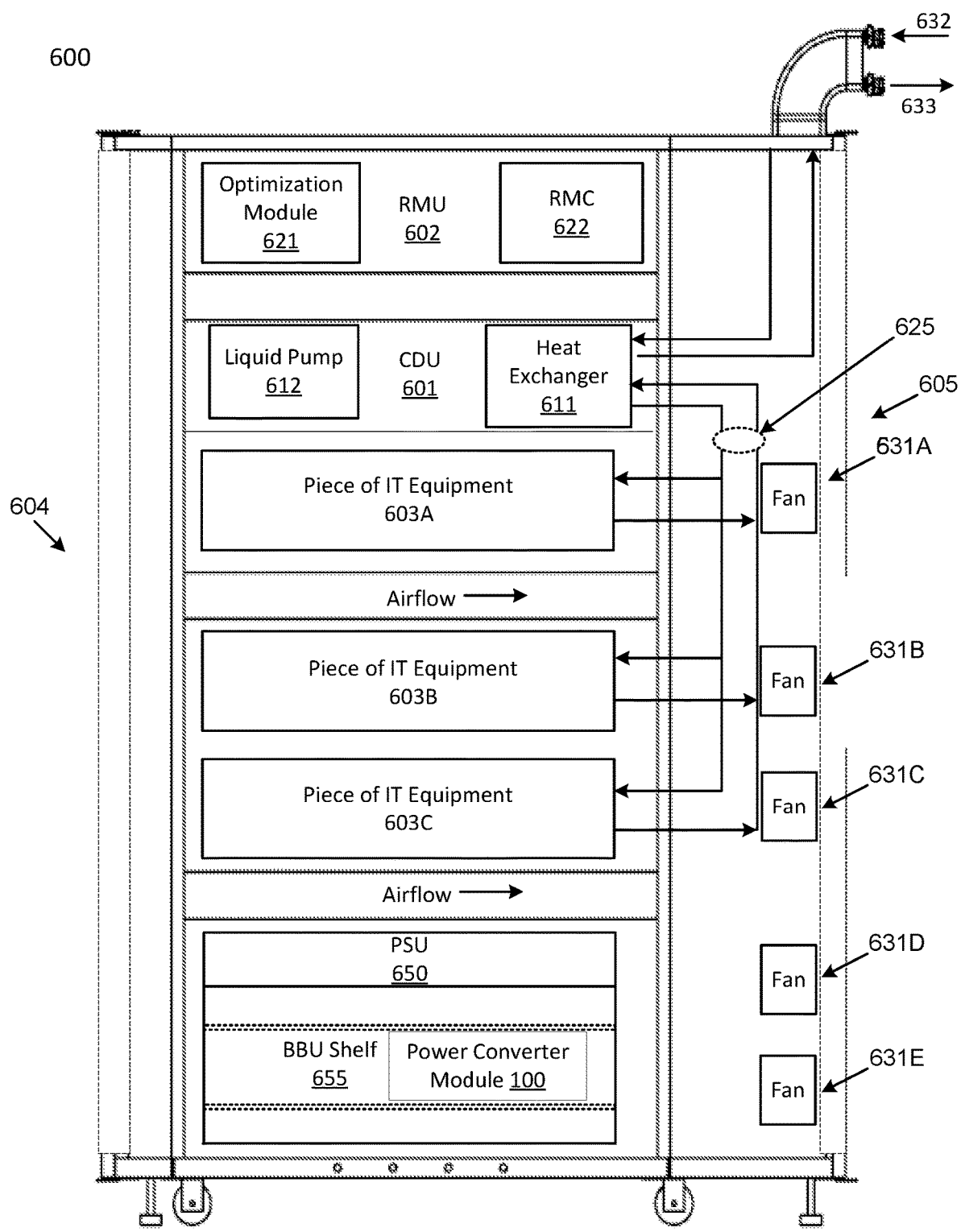
FIG. 6 is an electronic server rack including a battery backup unit with a power converter module, according to another embodiment of the disclosure.

FIG. 6 is a block diagram illustrating an example of an electronic rack with a BBU shelf 655 according to one embodiment. The BBU shelf 655 may include the power converter module 100 as discussed above. Electronic rack 600 may include one or more server slots to contain one or more servers respectively. Each server includes one or more information technology (IT) components (e.g., processors, memory, storage devices, network interfaces). According to one embodiment, electronic rack 600 includes, but is not limited to, CDU 601, rack management unit (RMU) 602 (optional), a power supply unit (PSU) 650, the BBU shelf 655, and one or more pieces of IT equipment (or IT equipment) 603A-603D, which may be any type of IT equipment, such as server blades. The IT equipment 603 can be inserted into an array of server slots respectively from front end 604 or back end 605 of electronic rack 600. The PSU 650 and/or BBU shelf 655 may be inserted into any of server slots within the electronic rack 600. In one embodiment, the BBU shelf 655 may be inserted into any of the server slots within the electronic rack 600. In another embodiment, the BBU shelf 655 may be inserted into several slots (e.g., taking up two or more slots within the rack). As illustrated, the BBU shelf 655 may be inserted at the bottom (below the PSU 650) of the rack. In one embodiment, along with or in lieu of a BBU shelf, the rack may house one or more BBUs.

In one embodiment, the BBU shelf 655 may include a power converter module 100. The power converter module 100 may be modularly connected or disconnected to the BBU shelf 655. For example, the BBU shelf 655 may include DC bus connections for the power converter module 100 to be connected. Battery cell packages may then be inserted individually to the power converter module 100 in the BBU shelf 655.

Note that although there are only three pieces of IT equipment 603A-603C shown here, more or fewer pieces of IT equipment may be maintained within electronic rack 600. Also note that the particular positions of CDU 601, RMU 602, PSU 650, BBU shelf 655, and IT equipment 603 are shown for the purpose of illustration only; other arrangements or configurations of these components may also be implemented. Note that electronic rack 600 can be either open to the environment or partially contained by a rack container, as long as the cooling fans can generate airflows from the frontend to the backend (or generate airflows from the backend to the frontend).

In addition, a fan module can be associated with each of the pieces of IT equipment 603, and the BBU shelf 655. In this embodiment, fan modules 631A-631E, collectively referred to as fan modules 631, and are associated with the pieces of IT equipment 603A-603D and BBU shelf 655, respectively. Each of the fan modules 631 includes one or more cooling fans. Fan modules 631 may be mounted on the back ends of IT equipment 603 and/or BBU shelf 655 to generate airflows flowing from frontend 604, traveling through the rack 600, and existing at backend 605 of electronic rack 600. In another embodiment, one or more of the fan modules may be positioned on the frontend 604 of the rack 600. Such frontend fans may be configured to push air into the pieces of IT equipment 603 and/or the BBU shelf 655.

In one embodiment, CDU 601 mainly includes heat exchanger 611, liquid pump 612, and a pump controller (not shown), and some other components such as a liquid reservoir, a power supply, monitoring sensors and so on. Heat exchanger 611 may be a liquid-to-liquid heat exchanger. Heat exchanger 611 includes a first loop with inlet and outlet ports having a first pair of liquid connectors coupled to external liquid supply/return lines 632-633 to form a primary loop. The connectors coupled to the external liquid supply/return lines 632-633 may be disposed or mounted on backend 605 of electronic rack 600. The liquid supply/return lines 632-633 are coupled to a set of room manifolds, which are coupled to an external heat removal system, or extremal cooling loop. In addition, heat exchanger 611 further includes a second loop with two ports having a second pair of liquid connectors coupled to liquid manifold 625 to form a secondary loop, which may include a supply manifold to supply cooling liquid to the pieces of IT equipment 603 and a return manifold to return warmer liquid back to CDU 601. Note that CDUs 601 can be any kind of CDUs commercially available or customized ones. Thus, the details of CDUs 601 will not be described herein.

Each of the pieces of IT equipment 603 may include one or more IT components (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. At least some of these IT components may be attached to the bottom of any of the cooling devices. IT equipment 603 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

In one embodiment, the BBU shelf 655 is configured to provide backup power (e.g., drawing battery energy from one or more BBUs contained therein) to the rack (e.g., one or more pieces of IT equipment 603) when the rack is not drawing power from a main power source, such as during a black out. In one embodiment, operations performed by the controller of the BBU shelf 655 may be performed by any of the components (e.g., IT equipment 603A) within the rack 600 (e.g., selecting operating modes and monitoring sensor data).

Electronic rack 600 further includes optional RMU 602 configured to provide and manage power supplied to servers 603, fan modules 631, and CDU 601. Optimization module 621 and RMC 622 can communicate with a controller in some of the applications. RMU 602 may be coupled to PSU 650 to manage the power consumption of the PSU 650. The PSU 650 may include the necessary circuitry (e.g., an alternating current (AC) to direct current (DC) or DC to DC power converter, backup battery, transformer, or regulator, etc.) to provide power to the rest of the components of electronic rack 600.

Note that some or all of the components as shown and described above may be implemented in software, hardware, or a combination thereof. For example, such components can be implemented as software installed and stored in a persistent storage device, which can be loaded and executed in a memory by a processor (not shown) to carry out the processes or operations described throughout this application. Alternatively, such components can be implemented as executable code programmed or embedded into dedicated hardware such as an integrated circuit (e.g., an application specific IC or ASIC), a digital signal processor (DSP), or a field programmable gate array (FPGA), which can be accessed via a corresponding driver and/or operating system from an application. Furthermore, such components can be implemented as specific hardware logic in a processor or processor core as part of an instruction set accessible by a software component via one or more specific instructions.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the disclosure also relate to an apparatus for performing the operations herein. Such a computer program is stored in a non-transitory computer readable medium. A machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments of the present disclosure are not described with reference to any particular programming language. It will be appreciated that a variety of programming languages may be used to implement the teachings of embodiments of the disclosure as described herein.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

What is claimed is:

1. A multiphase converter comprising:
 a main switch circuit comprising:
  a primary winding of a first coupled inductor,
  a primary winding of a second coupled inductor connected in parallel with the primary winding of the first coupled inductor and in parallel with an input voltage,
  a first switch connected between the primary winding of the first coupled inductor and the input voltage, and
  a second switch connected between the primary winding of the second coupled inductor and the input voltage; and
 a voltage multiplier cell including a secondary winding of the first coupled inductor, a secondary winding of the second coupled inductor, a second capacitor, and a first diode.

2. The multiphase converter of claim 1, wherein the voltage multiplier cell further comprises an active clamp circuit including a third switch, a fourth switch, and a first capacitor, wherein the fourth switch is connected in parallel with the third switch.

3. The multiphase converter of claim 2, wherein the secondary winding of the first coupled inductor, the secondary winding of the second coupled inductor, and the second capacitor are connected in series with one another, and in parallel with the third switch and the first diode.

4. The multiphase converter of claim 1, wherein a second diode is connected between the second capacitor and an output capacitor.

5. The multiphase converter of claim 2, configured to operate in a first mode, wherein the first switch and the second switch are closed and the third switch and the fourth switch are open.

6. The multiphase converter of claim 5, configured to operate in a second mode subsequent to operating in the first mode, wherein the first switch is closed and the second switch, third switch, and fourth switch are open.

7. The multiphase converter of claim 6, configured to operate in a third mode subsequent to operating in the second mode, wherein the first switch, second switch, and third switch are closed, and the fourth switch is open.

8. An electronic rack, comprising:
- a stack of server chassis, each server chassis including one or more servers;
- a power supply coupled to the server chassis to provide power to the servers;
- a battery backup unit (BBU) having a plurality of battery cell packages and each battery cell package containing one or more battery cells, wherein the BBU is configured to provide power to the servers when the power supply is unavailable; and
- a multiphase converter comprising:
  - a main switch circuit comprising:
    - a primary winding of a first coupled inductor,
    - a primary winding of a second coupled inductor connected in parallel with the primary winding of the first coupled inductor and in parallel with an input voltage,
    - a first switch connected between the primary winding of the first coupled inductor and the input voltage, and
    - a second switch connected between the primary winding of the second coupled inductor and the input voltage; and
  - a voltage multiplier cell including a secondary winding of the first coupled inductor, a secondary winding of the second coupled inductor, a second capacitor, and a first diode.

9. The electronic rack of claim 8, wherein the voltage multiplier cell further comprises an active clamp circuit including a third switch, a fourth switch, and a first capacitor, wherein the fourth switch is connected in parallel with the third switch.

10. The electronic rack of claim 9, wherein the secondary winding of the first coupled inductor, the secondary winding of the second coupled inductor, and the second capacitor are connected in series with one another, and in parallel with the third switch and the first diode.

11. The electronic rack of claim 8, wherein a second diode is connected between the second capacitor and an output capacitor.

12. The electronic rack of claim 9, configured to operate in a first mode, wherein the first switch and the second switch are closed and the third switch and the fourth switch are open.

13. The electronic rack of claim 12, configured to operate in a second mode subsequent to operating in the first mode, wherein the first switch is closed and the second switch, third switch, and fourth switch are open.

14. The electronic rack of claim 13, configured to operate in a third mode subsequent to operating in the second mode, wherein the first switch, second switch, and third switch are closed, and the fourth switch is open.

15. The electronic rack of claim 8, further comprising a plurality of multiphase converters connected in parallel with one another.

16. A method of operating a DC-DC converter, the method comprising:
providing a multiphase converter comprising:
- a main switch circuit comprising:
  - a primary winding of a first coupled inductor,
  - a primary winding of a second coupled inductor connected in parallel with the primary winding of the first coupled inductor and in parallel with an input voltage,
  - a first switch connected between the primary winding of the first coupled inductor and the input voltage, and
  - a second switch connected between the primary winding of the second coupled inductor and the input voltage; and
- a voltage multiplier cell including a secondary winding of the first coupled inductor, a secondary winding of the second coupled inductor, a second capacitor, and a first diode,
operating the multiphase converter in a first mode, wherein the first switch and the second switch are closed, and a third switch and a fourth switch are open;
operating the multiphase converter in a second mode subsequent to operating in the first mode, wherein the first switch is closed and the second switch, the third switch, and the fourth switch are open; and
operating the multiphase converter in a third mode subsequent to operating in the second mode, wherein the first switch, the second switch, and the third switch are closed, and the fourth switch is open.

17. The method of claim 16, wherein the voltage multiplier cell further comprises an active clamp circuit including the third switch, the fourth switch, and a first capacitor, wherein the fourth switch is connected in parallel with the third switch.

18. The method of claim 16, wherein the secondary winding of the first coupled inductor, the secondary winding of the second coupled inductor, and the second capacitor are connected in series with one another, and in parallel with the third switch and the first diode.

19. The method of claim 16, wherein a second diode is connected between the second capacitor and an output capacitor.

20. The method of claim 16, wherein each phase has a 180-degree phase delay when switching.

* * * * *